United States Patent [19]

Matsuoka et al.

[11] Patent Number: 5,186,642

[45] Date of Patent: Feb. 16, 1993

[54] CONNECTOR

[75] Inventors: Noriyuki Matsuoka, Yokohama; Kazumi Uratsuji, Tokyo, both of Japan

[73] Assignee: Yamaichi Electric Co., Ltd., Tokyo, Japan

[21] Appl. No.: 900,461

[22] Filed: Jun. 18, 1992

Related U.S. Application Data

[62] Division of Ser. No. 692,253, Apr. 26, 1991, abandoned.

[30] Foreign Application Priority Data

May 14, 1990 [JP] Japan .................................. 2-124487

[51] Int. Cl.$^5$ .......................................... H01R 11/22
[52] U.S. Cl. .................................... 439/268; 439/266; 439/331
[58] Field of Search ........................ 439/259, 261–268, 439/73, 152, 331

[56] References Cited

U.S. PATENT DOCUMENTS

| 4,433,886 | 2/1984 | Cassavly et al. | 439/331 |
| 4,502,747 | 3/1985 | Bright et al. | 439/331 |
| 4,547,031 | 10/1985 | Kovsunsky | 439/331 |
| 4,993,755 | 2/1991 | Savant | 439/73 |
| 5,037,321 | 8/1991 | Uratsuji et al. | 439/342 |

Primary Examiner—Larry I. Schwartz
Assistant Examiner—Hien D. Vu
Attorney, Agent, or Firm—Wenderoth, Lind & Ponack

[57] ABSTRACT

A connector including a connector body, a movable plate mounted to the connector body, an operating lever, a contacting state and a contact-releasing state being formed by a lateral movement of the movable plate, the connector comprising an upper part operating member disposed above the operating lever for movement upward and downward, and a pressure bearing portion formed on one end portion of the operating lever and adapted to carry the upper part operating member, pushing down operation of the upper part operating member causing the pressure bearing portion to be pushed down to move the movable plate in a lateral direction.

2 Claims, 5 Drawing Sheets

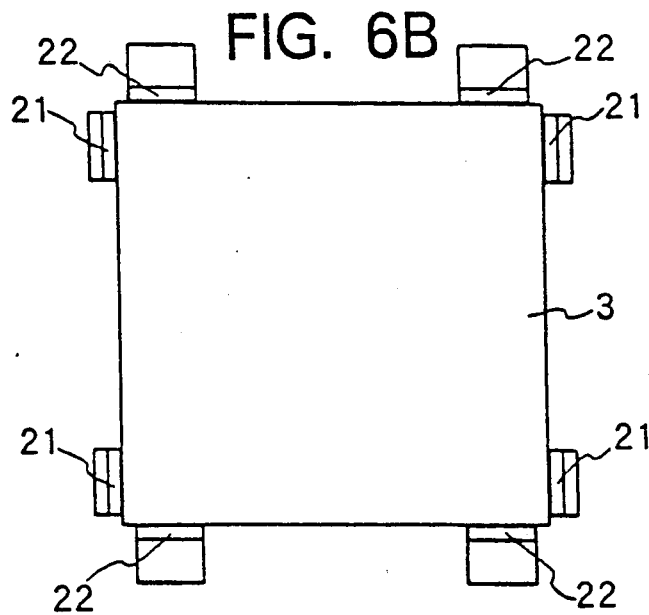
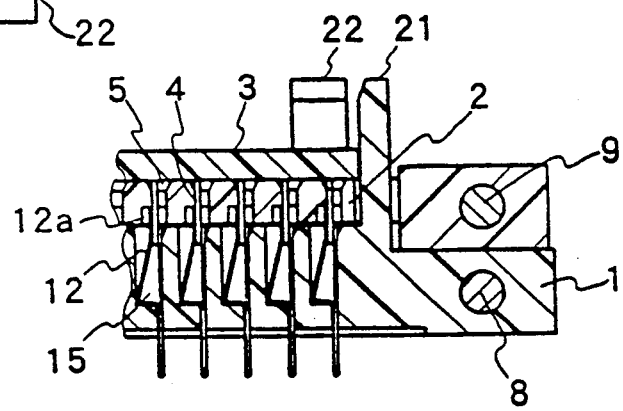
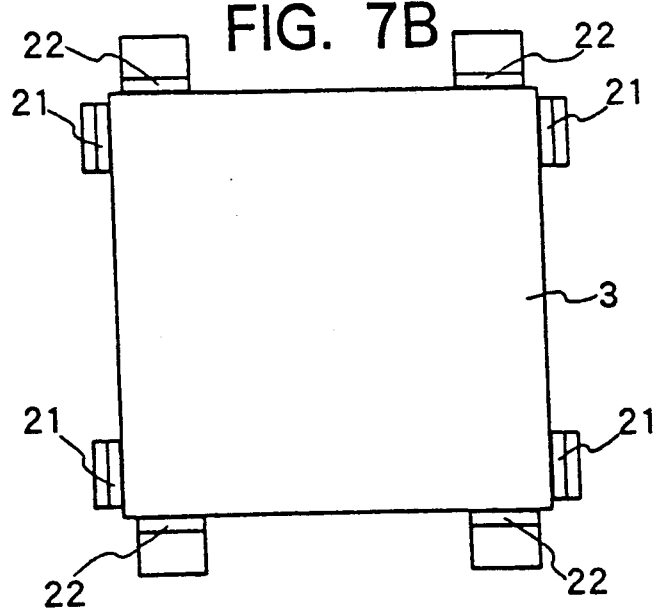

CONNECTOR

This is a Rule 1.60 divisional application of Ser. No. 07/692,253, filed Apr. 26, 1991, now abandoned.

BACKGROUND OF THE INVENTION

1. Field of the Invention

This invention relates to a connector having a moving plate adapted to be in a contacting state and a non-contacting state in a connector body.

2. Brief Description of the Prior Art

A conventional connector known to the art aims at no-load insertion and removal of an IC package to and from an IC socket and includes a movable plate mounted on a connector body, and an causing lever for operating a lateral movement of the movable plate, so that a contacting state and a released state can be produced by the lateral movement of the movable plate.

By means of pushing down the operating lever, the movable plate is laterally moved in one direction along the upper surface of the connector body. The lateral movement of the movable plate causes the contacts of the connector body to be displaced to an open state, thereby forming a contact released state relative to the IC leads of an IC package placed on the movable plate so that no-load insertion of the IC package to the IC socket can be obtained. On the other hand, by releasing the pushing down condition, the movable plate is urged by restoring force of the contacts and laterally moved in the opposite direction, thereby producing a contacting state relative to the IC leads.

In recent years, a robot was used in many cases for operation of the operating lever in order to enhance workability and to save energy. Therefore, the operating lever is required to have a construction by which the operating lever can easily be pushed down by means of a vertical movement of a robot.

However, the conventional connector has the following problems. That is, a lever is used as means (operating lever) for moving the movable plate in the lateral direction with a small amount of force. However, the movement of a lever is a pivotal movement, while the movement of a robot is a vertical movement. Since the moving directions are different, the pushing down position of the lever is limited and as a result, it is difficult to operate the robot effectively. Moreover, where a plurality of operating levers are provided on the connector body, these levers must be individually pushed down at the same time.

The above-mentioned problems also arise where an operating lever or levers are manually operated.

Furthermore, in the above-mentioned prior art, when the contacts are displaced by the reciprocal movement of the movable plate, an electric part mounted on the movable plate is also moved following the movement of the movable plate and therefore, the mounting position of the electric part is changed.

In recent years, since the operation of removing an electric part, especially an IC package, is made by an automation device such as a robot or the like, the accessing position of the automation device must be changed if the mounting position is changed. As a result, there occurs a failure in removal of the electric part and male terminals are deformed because the electric part is removed while in its inclined state. Moreover, the change of the mounting position causes the contacting position and the contact released position between the male terminals and contacts to become unstable. As a result, reliability of the contacting relation is badly jeopardized.

The present invention has been accomplished in order to overcome the above-mentioned problems inherent in the prior art.

SUMMARY OF THE INVENTION

It is therefore a first object of the present invention to provide a connector which can easily cope with automation requirement using a robot.

A second object of the present invention is to provide a connector including a movable plate for displacing contacts, in which the mounting position of an electric part relative to a connector body is always held in a predetermined position so that the mounting and removing operation of the electric part can be properly carried out by an automation device and at the same time, the contacting position and the contact released position of the electric part relative to the connector can be obtained properly.

In order to achieve the above objects, there is essentially provided a connector including a connector body, a movable plate mounted on said connector body, an operating lever, a contacting state and a contact released state being formed by a lateral movement of said movable plate, said connector comprising an upper part operating member disposed above said operating lever for movement upward and downward, and a pressure bearing portion formed on one end portion of said operating lever and adapted to carry said upper part operating member, pushing down said upper part operating member causing said pressure bearing portion to be pushed down to move said movable plate in a lateral direction.

According to the connector of the present invention, the operating lever can be pushed down by vertically pushing down the upper part operating member by the vertical motion of a robot. The contacting position between a manipulator of the robot and the upper part operating member is held in a predetermined position and the pushing down operation is performed in that state. Moreover, an operating position for the robot is provided by the upper part operating member, thus enabling automation using a robot to be carried out properly.

Furthermore, manual operation can also be performed with ease. For example, where a plurality of operating levers are provided, all of these operating levers can be pushed down at the same time by the upper part operating member to move the movable plate properly in the lateral direction.

From another aspect of the invention, there is essentially provided, in order to achieve the above objects, a socket comprising a connector body which is held in a stationary state when mounted on a wiring board, etc., a guide mounted on said connector body in such a manner as to be projected upward of a movable plate along the side edge portion of a reciprocal motion of said movable plate, said guide regulating both end faces of an electric part at a portion projecting upward of said movable plate, in order to prevent the electric part from following the reciprocal movement of the movable plate and to maintain a fixed relative position.

From still another aspect of the invention, there is essentially provided a socket comprising a connector body, a first guide mounted on the connector body, a movable plate and a second guide mounted on said movable plate, a loading position of an electric part being established by said first and second guides.

According to the above described invention, the guide on the connector body is projected upward of the movable plate past one end thereof, and an electric part is regulated at both end faces thereof by the projecting part of the guide so that the electric part can be loaded in a predetermined position.

Furthermore, when the movable plate is reciprocally moved in order to displace the contacts into a contact-released state, the projecting part of the guide projecting upwardly from one end of the connector body prevents the electric part from moving is one direction following the movement of the movable plate and the projecting part of the guide on the other end of the connector body prevents the electric part from moving is the other direction following the movement of the movable plate, thereby maintaining the predetermined loading position of the electric part.

As a result, the position of the electric part relative to the connector body is normally held constant and does not fluctuate even if the movable plate is moved. Accordingly, there can be overcome such problems as that the electric part is incorrectly taken out or loaded by an automation device, and the male terminals are deformed when the electric part is removed by an automation device.

On the other hand, the movable plate is assured an independent movement for operating to displace the contacts, and a contacting relation and a contact released relation between the male terminals and the contacts can properly be obtained.

Furthermore, by projecting the first guide upwardly from the connector body and the second guide from the moving plate, the position of the electric part can more surely be established and the reciprocal movement of the movable plate can properly be performed while maintaining a relative position of the electric part.

The above and other objects and features of the present invention will be more manifest to those skilled in the art upon reading the following detailed description of the embodiment with reference to the accompanying drawing.

BRIEF DESCRIPTION OF THE DRAWING

FIG. 6(B) is a plan view showing a positional relationship between the electric part and the first and second guides in FIG. 6(A); and FIG. 7(A) is a sectional view of the connector in which the movable plate is in a position for forming a state in which the terminals are clamped by the contacts, and FIG. 7(B) is a plan view showing a positional relationship between the electric part and the first and second guides in FIG. 7(A).

DETAILED DESCRIPTION OF THE EMBODIMENT

One embodiment of the present invention will be described hereinafter with reference to FIGS. 1 through 7.

The numeral 1 denotes a connector body mounted on a wiring board or the like. The connector body 1 has a movable plate 2 which moves along the upper surface of the connector body 1.

Figure 1:
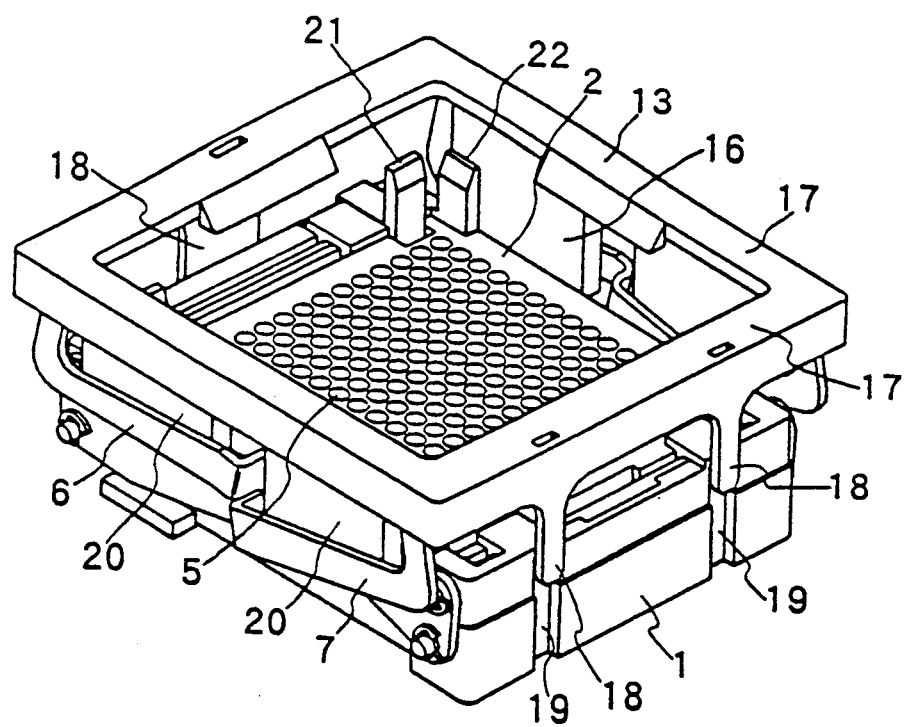
FIG. 1 is a perspective view showing one embodiment of a connector according to the present invention.
Figure 2:
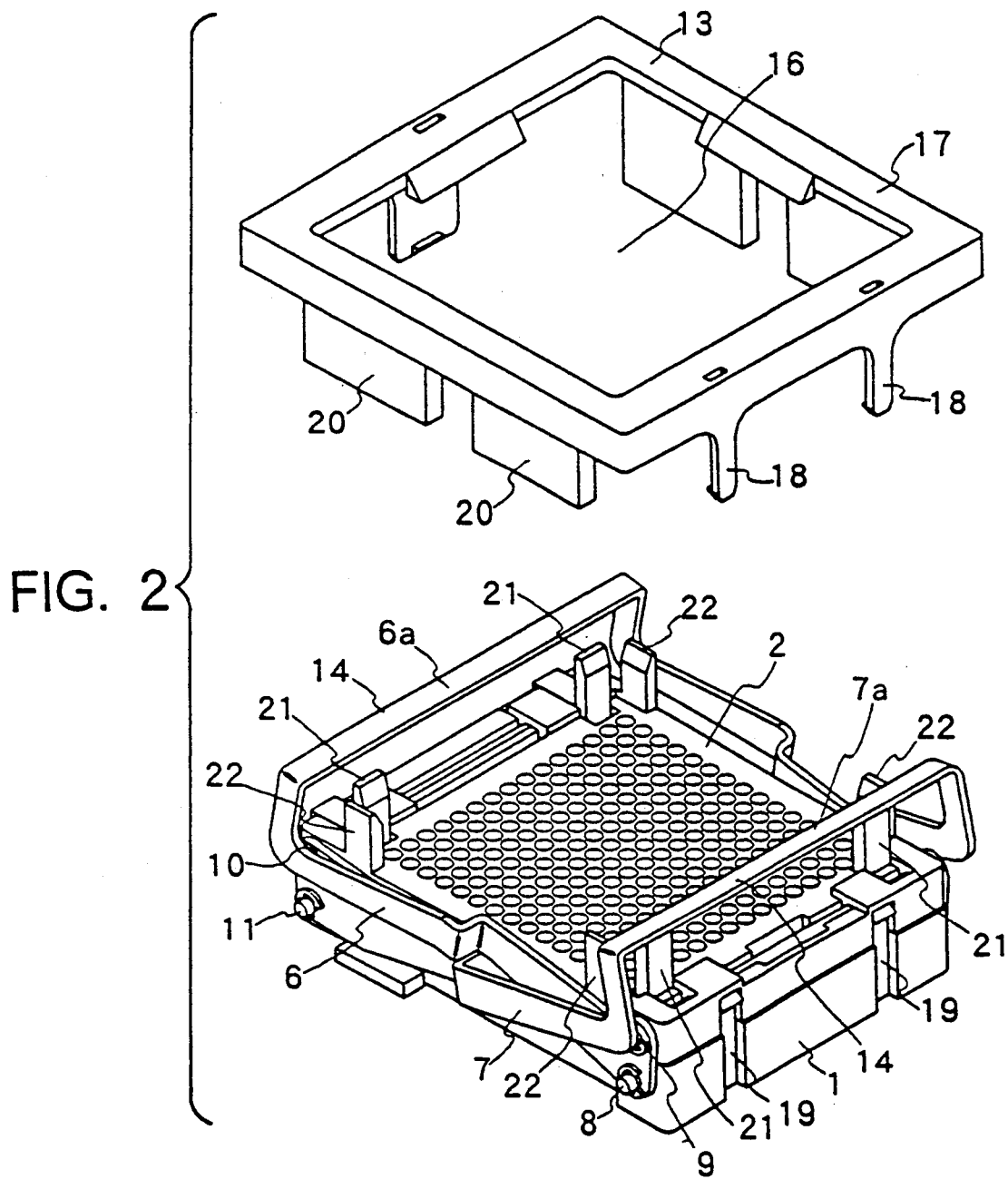
FIG. 2 is an exploded perspective view of an upper part operating member disengaged from the connector of FIG. 1.
Figure 3:
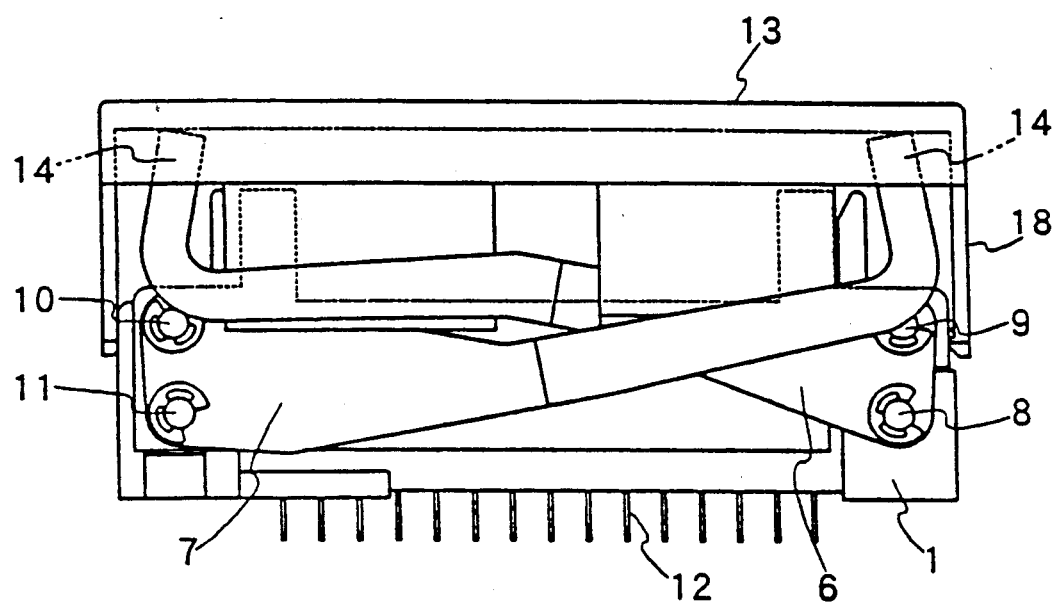
FIG. 3 is a side view of the connector before the upper part operating member is pushed down.
Figure 4:
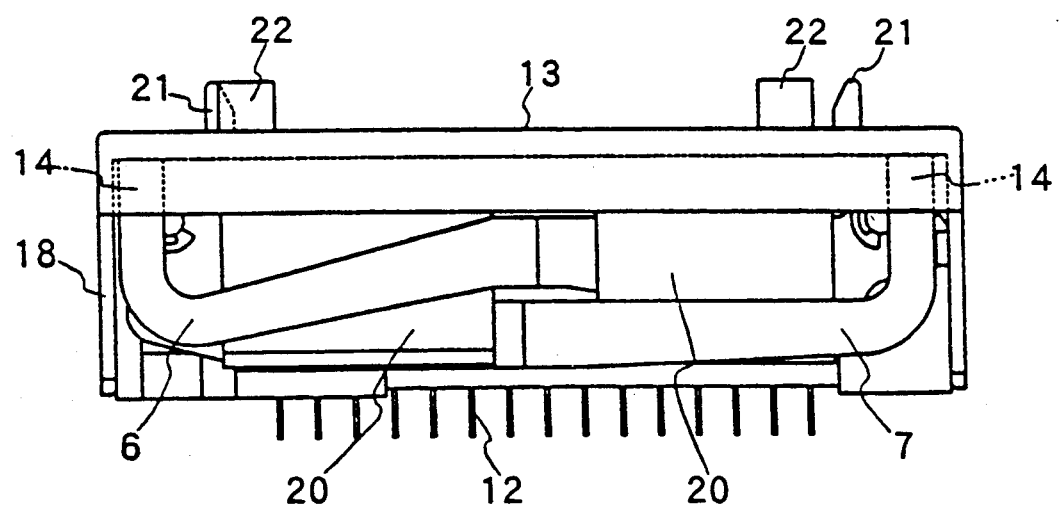
FIG. 4 is a side view of the connector after the upper part operating member is pushed down.
Figure 5A:
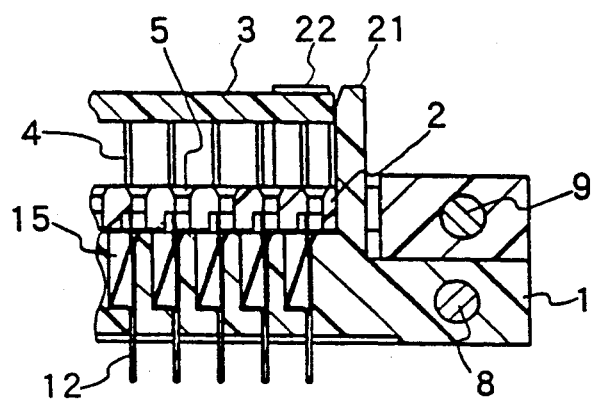
FIG. 5(A) is a sectional view of the connector in which a movable plate is in a position for producing a closed state of contacts.
Figure 5B:
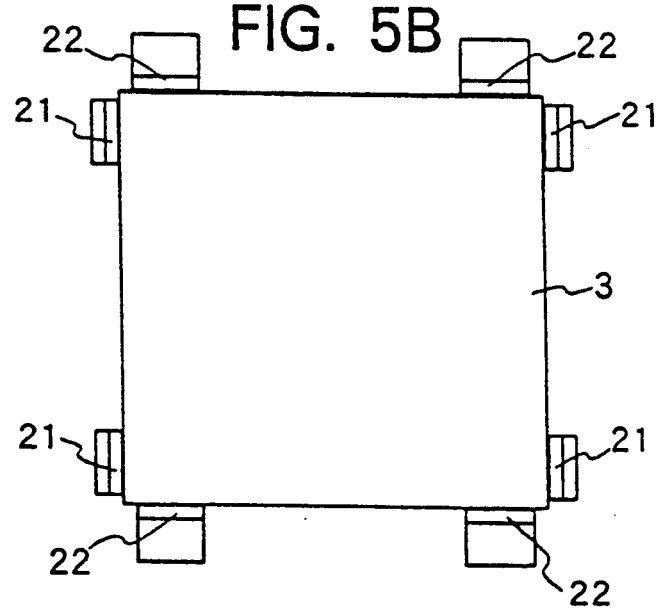
FIG. 5(B) is a plan view showing a positional relationship between an electric part and first and second guides in FIG. 5(A)
Figure 6A:
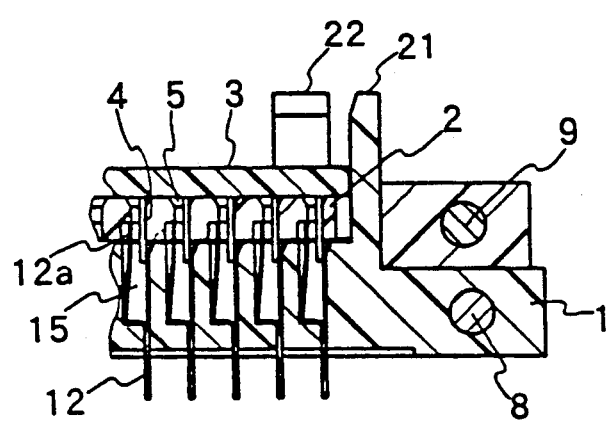
FIG. 6(A) is a sectional view of the connector in which the movable plate is in a position for producing an opened state of the contacts.

The movable plate 2 is superposed on the upper surface of the connector body 1. The movable plate 2 is provided with a plurality of holes 5 for permitting a plurality of male terminals 4 of an electric part 3 to extend therethrough. While placing the electric part 3 on the upper surface of the movable plate 2, the male terminals 4 are inserted into the terminal penetration holes 5 and the tips of the male terminals 4 are inserted into contact accommodation chambers 15 which are formed in the connector body 1 in such a manner as to correspond to the terminal penetration holes 5. Normally closed, contacts 12 are accommodated in the contact accommodation chambers 15 of the connector body 1 and one contact element 12a of each of the contacts 12 for normally resiliently engaging the male terminals 4, as shown in FIG. 5a, is engaged by the movable plate 2. The lateral movement of the movable plate 2 in the above-mentioned one direction, to the left in FIGS. 5A and 6A, causes the contact element 12a to be displaced against resiliency thereof to bring each of the contacts 12 into an opened state as shown in FIG. 6A. Also, by applying a restoring force of the contact element 12a to the movable plate 2, the movable plate 2 is laterally moved in the other direction to bring each of the contacts 12 into a closed state. No load insertion and removal of the electric part 3 is performed in the above-mentioned opened state as shown in FIG. 5A of each of the contacts 12, while each of the male terminals 4 are clamped in the closed state.

As means for performing the lateral movement operation of the movable plate 2, the connector of the present invention includes a first operating lever 6 and a second operating lever 7. A lower part of one end of the first operating lever 6 is pivotably axially supported by a supporting shaft 8 at one end of one side surface of the connector body 1, and an upper part of the same end of the operating lever 6 is axially supported by a transmission shaft 9 at one end of the same side surface of the movable plate 2. An, an upper part of one end of the second operating lever 7 is pivotably axially supported by a supporting shaft 10 at the other end of the same side surface of the connector body 1, and a lower part of the same end of the operating lever 7 is axially supported by a transmission shaft 11 at the other end of the same side surface of the movable plate 2.

The arrangement is such that the transmission shafts 9 and 11 transmit a lateral force in one direction to the movable plate 2 when the first and second operating levers 6 and 7 are pivoted downward about the supporting shafts 8 and 10 and transmit a lateral force in the other direction to the movable plate 2 when both of the first and second operating levers 6 and 7 are pivoted upward.

That is, the upper and lower positional arrangement of the supporting shaft 8 and the transmission shaft 9 at one end of the first operating lever 6 is in a reversed relation with the upper and lower positional arrangement of the supporting shaft 10 and the transmission shaft 11 at one end of the second operating lever 7.

An upper part operating member 13 is vertically movably disposed above the first and second operating levers 6 and 7, and the operating member 13 is horizontally carried by pressure bearing portions 14 each formed on the first and second operating levers 6 and 7.

The first and second operating levers 6 and 7 extend in the opposite direction with respect to each other along the side surface of the connector body 1. The first operating lever 6 is provided at its free end with the pressure bearing portion 14 adapted to support one end of the upper part operating member 13, while the second operating lever 7 is provided at its free end with the pressure bearing portion 14 adapted to support the other end of the upper part operating member 13. As one modified example, it may be designed such that pairs of the first and second operating levers 6 and 7 are arranged in a symmetric relation with respect to each other on both sides of the connector body 1 and, the free ends of the respective pairs of first and second operating levers 6 and 7 are connected together above the movable plate 2, connection bars 6a and 7a serving as the pressure bearing portions 14.

The upper part operating member 13 has an opening 16 corresponding to the upper surface of the movable plate 2 and has a generally framework configuration as a whole. The electric part 3 is inserted and removed through the opening 16. The upper part operating member 13 is horizontally carried on the pressure bearing portions 14 formed on the connection bars 6a and 7a. The framework element 17 carried on the connection bars 6a and 7a forming the pressure bearing portions 14 has a generally inverted L shape cross section, and the connection bars 6a and 7a are engaged with the inner side of the generally inverted L shape of the framework element 17.

The upper part operating member 13 supported by the pressure receiving portions 14 is provided with guide elements 18 extending downward from the framework element 17, and the guide elements 18 are inserted into guide grooves 19 formed in one side surface of the connector body 1. Furthermore, the upper part operating member 17 is provided with guide elements 20 extending downward from the framework 17 which are disposed in parallel relation with the operating levers 6 and 7, and the guide elements 20 are inserted into a crossing parts of the operating levers 6 and 7. By means of operation of either one or both of the operating guide elements 18 and 20, the vertical upward and downward movement of the upper part operating member 13 is guided and the position of the upper part operating member 13 is secured with respect to the connector body 1 and the operating levers 6 and 7.

When the upper part operating member 13 is vertically pushed down either by robot or hand, the pushing down force is applied to the pressure receiving portions 14 of the operating levers 6 and 7. As a result, the operating levers 6 and 7 are pivoted downward about the supporting shafts 8 and 10, and the pivotal force is transmitted to the movable plate 2 through the transmission shafts 9 and 11. As a result, the movable plate 2 is laterally moved from a position shown in FIG. 5(A) to a position shown in FIG. 6(A) along the upper surface of the connector body 1. The lateral movement of the movable plate 2 causes the contact elements 12a of the contacts 12 to be displaced against the resilient force to an opened state. In the opened state of the contacts 12, the electric part 3 is inserted and removed with no-load on the terminals thereof.

When the pushing down force on the upper part operating member 13 is released, the movable plate 2 is laterally moved in the opposite direction from the position shown in FIG. 6(A) to the position shown in FIG. 5(A) by the restoring force of resiliency of the contact elements 12a of the contacts 12. As a result, the contacts 12 are brought into a closed state and the terminals 4 of the electric part 3 are clamped to form a contacting relation.

The connector body 1 is provided with first guides 21 extending upward from corner portions thereof along the end portions of the reciprocal movement side such that upper ends of the first guides 21 project upward of the movable plate 2. Front and rear end faces of the electric part 3 placed on the movable plate 2 are engaged by the projecting portions of the first guides 21, so that the electric part 3 will not be laterally moved following the lateral movement of the movable plate 2. As a result, the insertion positions of the terminals 4 with respect to the contacts 12 of the connector body 1 are held constant. Furthermore, the connector body 1 is provided with second guides 22 extending upward from the sides perpendicular to the above-mentioned reciprocal movement direction of the movable plate 2 and adapted to move integrally together with the movable plate 12 while regulating the right and left side surfaces of the corner portions of the electric part 3. The second guides 22 regulate the right and left side surfaces of the electric part 3 so that the electric part 3 is held in a predetermined mounting position.

Owing to the foregoing arrangement, only the movable plate 2 is reciprocally laterally moved to open and close the contacts 12. The electric part 3 is held in a constant position without following the movement of the movable plate 2. As a result, the contacting relation and the contact-released relation between the male terminals 4 inserted in predetermined positions and the contacts 12 is maintained The above-described operating lever is only one example. It goes without saying that the present invention can likewise be applied to connectors having various kinds of levers which, when pushed down, move a movable plate in the lateral direction. The invention is of course not limited to two pairs of operation levers, either. Instead, it may have one pair of operating levers.

As described in the foregoing, the upper part operating member 13 can be vertically downwardly moved, either by robot or hand, following the vertical pushing down operation, and the operating levers 6 and 7 can be operated to pivot downward through the vertical movement of the upper part operating member 13.

Furthermore, the manipulator of the robot and the upper part operating member 13 can perform the above-mentioned pushing down operation without generating displacement of the contacting position and while remaining in a predetermined position. By the upper part operating member 13 serving as a pushing down member for the operating levers 6 and 7, it can properly cope with the automation requirement using a robot and the pushing down operation by suitable means can also be performed with ease.

Moreover, where a plurality of operating levers are employed, all of them can be pushed down at the same time by the operating member 13. As a result, the lateral movement of the movable plate 2 and the opening and closing operation of the contacts can properly be performed.

Furthermore, since the mounting position of the electric part 3 is secured by the guides 21 and 22 and is not shifted by following the movement of the movable plate 2, there can be obviated such problems as that the electric part is incorrectly taken out or loaded by an automation device, and the male terminals are deformed when the electric part is removed by an automation device.

On the other hand, the movable plate 2 is assured an independent movement to displace the contacts 12, and a contacting relation and a contact-Released relation between the male terminals 4 and the contacts 12 can properly be obtained.

Furthermore, by the first guide 21 projecting upwardly from the connector body 1 and the second guide 22 from the moving plate 2, the position of the electric part 3 can more surely be established and the reciprocal movement of the movable plate 2 can properly be performed while maintaining a fixed relative position of the electric part 3.

From the foregoing, it will be seen that a novel and efficient connector has been described herein. The descriptive and illustrative materials employed herein are utilized for purposes of exemplifying the invention and not in limitation thereof. Accordingly, numerous modifications of the invention will occur to those skilled in the art without departing from the spirit and scope of the present invention. Moreover, it is to be understood that certain features of the present invention can be used to advantage without a corresponding use of other features thereof.

What is claimed is:

1. A connector for mounting an electric element having dependent terminals thereon and removing it from a circuit means, comprising:

a connector body having a plurality of terminal receiving apertures therethrough each having a contact means therein with a contact part movable from a normally closed position where it contacts a terminal inserted into the aperture to an open position to permit no-load insertion and removal of the terminal;

a movable plate mounted on said connector body for reciprocal movement along said body in a direction between ends of said body and transverse to said apertures and engaged with the contact elements so that, when the plate is moved in one direction along said body, the contact elements are moved to the open position;

operating lever means connected between said connector body and said movable plate and having a free end means engagable for causing pivoting movement of said operating lever means to move said movable plate in said one direction;

an operating member engagable with said free end means for moving said lever means in pivotal movement;

a first guide means on said connector body at the ends thereof and projecting upwardly above said movable plate for engaging opposite edges of an electric element to be mounted on said connector for ensuring that the element is positioned correctly on said movable plate in said one direction; and a second guide means on said movable plate at opposite sides thereof and projecting upwardly therefrom for engaging opposite edges of the electric element to be mounted for ensuring that the element is positioned correctly on said movable plate in a direction transverse to said one direction.

2. A connector as claimed in claim 1 in which said first and second guide means are first and second guide projections projecting upwardly from the surfaces of the respective connector body and movable plate.

* * * * *